(12) United States Patent  (10) Patent No.: US 8,468,438 B2
Heinrich et al.  (45) Date of Patent: Jun. 18, 2013

(54) METHOD AND APPARATUS FOR ELEMENTARY UPDATING A CHECK NODE DURING DECODING OF A BLOCK ENCODED WITH A NON-BINARY LDPC CODE

(75) Inventors: Vincent Heinrich, Izeaux (FR); Julien Begey, Offemont (FR)

(73) Assignee: STMicroelectronics SA, Montrouge (FR)

( * ) Notice: Subject to any disclaimer, the term of this patent is extended or adjusted under 35 U.S.C. 154(b) by 324 days.

(21) Appl. No.: 12/880,844

(22) Filed: Sep. 13, 2010

(65) Prior Publication Data

US 2011/0066917 A1    Mar. 17, 2011

(30) Foreign Application Priority Data

Sep. 14, 2009 (FR) .................................. 09 56304

(51) Int. Cl.
*G06F 11/00* (2006.01)
*H03M 13/00* (2006.01)

(52) U.S. Cl.
USPC ........................................................ 714/800

(58) Field of Classification Search
USPC .................................. 714/778–780, 800–801
See application file for complete search history.

(56) References Cited

U.S. PATENT DOCUMENTS 7,747,923 B2 * 6/2010 Dabiri et al. .................. 714/758
2008/0197982 A1 * 8/2008 Sadr .............................. 340/10.4

FOREIGN PATENT DOCUMENTS

FR    2 920 929 A1    3/2009

OTHER PUBLICATIONS

Voicila, A., et al., "Low-complexity, Low-memory EMS algorithm for non-binary LDPC codes," IEEE International Conference on Communications, Jun. 24-28, 2007, pp. 671-676.
Shams et al., "Non-binary split LDPC Codes defined over Finite Groups," ST-Microelectronics, Crolles, France; Wireless Communications Systems, 2009. ISWCS 2009. 6$^{th}$ International Symposium, IEEE Piscataway, NJ, USA, Sep. 7, 2009 (pp. 493-497).

* cited by examiner

*Primary Examiner* — Shelly A Chase
(74) *Attorney, Agent, or Firm* — Slater & Matsil, L.L.P.

(57) ABSTRACT

Method of elementary updating a check node of a non-binary LDPC code during a decoding of a block encoded with said LDPC code, comprising receiving a first input message (U) and a second input message (V) each comprising $n_m$ doublets having a symbol and an associated metric, delivering an output message (S) possessing $n_m$ output doublets by computing a matrix of $n_m^2$ combined doublets on the basis of a combination of the doublets of the two input messages (U,V), and reducing the number of the combined doublets so as to obtain the $n_m$ output doublets of the output message (S) possessing the $n_m$ largest or lowest metrics. The method further includes tagging redundant symbols within each input message (U, V) and fixing same at a reference value, the value of the metric of each combined doublet resulting from a combination of at least one doublet comprising a tagged redundant symbol.

20 Claims, 4 Drawing Sheets

METHOD AND APPARATUS FOR ELEMENTARY UPDATING A CHECK NODE DURING DECODING OF A BLOCK ENCODED WITH A NON-BINARY LDPC CODE

CROSS REFERENCE TO RELATED APPLICATION

This application claims priority benefit of French Patent Application 09-56304, which was filed Sep. 14, 2009, and entitled "Method of Elementary Updating of a Check Node During a Decoding of a Block Encoded With a Non-Binary LDPC Code, and Corresponding Decoder," which is hereby incorporated by reference to the maximum extent allowable by law.

TECHNICAL FIELD

The present invention relates to decoding blocks of code whose parity matrix exhibits a low density, that is to say, comprises a low number of 1s. Such codes are known to those skilled in the art as "LDPC codes" ("Low Density Parity Check"). More particularly, the invention relates to the elementary updating of a check node during LDPC decoding.

BACKGROUND

The LDPC code is a code based on blocks. The encoder processes blocks of K bits and delivers blocks of N bits. Thus, N-K redundancy bits are added. These N-K bits are called "parity bits". The coding rate (or "Code rate") is defined by the ratio K/N. The lower the coding rate, the higher the number of redundancy bits and thus the greater the protection against noise of the transmission channel.

These N-K parity bits are calculated with the aid of a parity matrix H. The LDPC code is therefore also a code based on a matrix. This matrix has N-K rows and N columns and is composed of "1s" and "0s" with a low number of "1s" relative to the number of "0s". This is why codes of this type based on such a matrix are dubbed "LDPC codes", that is to say low-density codes. The encoded block BLC, of N bits, is calculated by solving the equation $H \cdot BLC^T = 0$, where H denotes the parity matrix, and T the "transpose" function.

On the decoder side, correction of erroneous bits is performed on the basis of the relations between the coded information of the block received. These relations are given by the parity matrix H. The decoder uses internal metrics corresponding to the "1s" of the matrix H. The matrix H corresponds to the Tanner graph of the LDPC code comprising so-called check nodes and information nodes (or "bit nodes") linked together by paths of the graph that are representative of the messages iteratively exchanged between the nodes thus linked. These metrics are updated row-wise (updating of the check nodes), taking into account the internal metrics of each row. Thereafter, the decoder updates these metrics column-wise (updating of the information nodes), taking into account the internal metrics in each column as well as the corresponding information input to the decoder and originating from the transmission channel. An iteration corresponds to the updating of the check nodes for all the internal metrics, followed by the updating of the information nodes for all the internal metrics. The decoding of a block requires several iterations.

The values of the decoded bits, also called "hard decisions," are obtained by adding together the internal metrics column-wise and the information received and by taking the sign of the result. The result is also called a "soft decision" or LLR (Log Likelihood Ratio). The sign of the result provides the value "0" or "1" of the bit while the absolute value of the result gives a confidence indication (probability) for this "0" or "1" logic value.

Codes of the LDPC type are beneficial since they make it possible to obtain a very low bit error rate (BER), because of the iterative character of the decoding algorithm. Several iterative decoding algorithms exist for decoding LDPC codes. Mention may in particular be made of the conventional so-called "belief propagation" (BP) algorithm, well known to the person skilled in the art.

For moderate sizes of code words, one of the most effective solutions for obtaining good error performance is to use LDPC codes constructed on non-binary Galois fields of order q, denoted GF(q). The Galois field is non-binary when q is greater than 2. Non-binary LDPC codes represent a more general class of LDPC codes considering sets of bits in a block instead of independent bits. Each set of bits forms a chosen symbol in a Galois field. For example, symbols composed of 8 bits can be included in Galois fields GF(256) comprising 256 symbols, instead of two symbols "0" or "1" in a binary code.

An LDPC code in a Galois field GF(q) is defined by a sparse parity matrix H whose nonzero elements belong to GF(q). However, the associated decoders, without particular simplification, have the disadvantage of having a complexity that varies as O(q2). Consequently, no field of order larger than q=16 can be considered for a "hardware" implementation using technology commonly available today.

The updating of a check node is an operation which takes a significant amount of the decoding time. It can be considered to be a function applied to the Dc messages corresponding to the nonzero symbols of a row of the parity matrix H. The updating of a check node updates these Dc messages.

If F denotes the function making it possible to calculate the updating of the messages, with Ei an original message, the updated message $E'_k$ is defined by:

$$E'_k = F(E_i) \forall i \in [0, D_c - 1], i \neq k \quad (1)$$

Equation (1) implies that the updating of each message requires the other Dc-1 messages. In practice, a recursive application of an elementary function denoted G is used to calculate the Dc updated messages. We then have:

$$E'_k = G(E_0, G(E_1, \ldots G(E_i, \ldots G(E_{Dc-2}, E_{Dc-1}) \ldots ))) \quad (2)$$

Equation (2) shows that the function G is applied in a recursive manner to the input messages. Thus, to minimize the global latency time, the latency time of G must be minimal. The function G corresponds to an elementary update operation.

An elementary update receives two input messages and produces an output message possessing the same format as the input messages. In the case where a simplified decoding algorithm of Extended Min-Sum (EMS) type is used, mentioned in the document "Low-complexity, low-memory EMS algorithm for non-binary LDPC codes" published in the IEEE journal of 24-28 Jun. 2007 (Institute of electrical and electronic engineers), each message is composed of two vectors of $n_m$ values, $n_m \ll q$. A first vector comprises the $n_m$ metrics sorted in decreasing order, these metrics possibly being values comprising a sign and coded on $N_{llr}$ bits, and a second vector comprises the $n_m$ symbols belonging to the Galois field GF(q) that are associated with the metrics of the first vector, the symbols being coded on log 2(q) bits, i.e. for example 8 bits for a decoder operating on the Galois field GF(256), and sorted in the same order as the associated metrics.

Stated otherwise, it may thus be considered that each message comprises $n_m$ doublets, a doublet comprising a symbol and the metric associated with the symbol. The $n_m$ doublets of each message are ranked in decreasing order as a function of the metrics.

The objective of an elementary update operation is to obtain the $n_m$ most probable symbols, that is to say the $n_m$ symbols associated with the largest metrics. There are theoretically $n_m^2$ candidates given that as input there are two messages each comprising $n_m$ doublets. A square matrix of dimension $n_m^2$ is thus obtained, arising from the combination of the two messages, comprising $n_m^2$ doublets. Each doublet of the square matrix comprises a combination of the two symbols and the combination of the associated metrics. The combination of two metrics corresponds to their algebraic sum and the combination of the associated symbols corresponds to the sum in the set GF(q) of the symbols, that is to say an XOR operation performed bit by bit. The elementary update is aimed at exploring the square matrix of dimension $n_m^2$ and at extracting the $n_m$ most probable symbols, that is to say the $n_m$ symbols associated with the $n_m$ largest metrics.

As the messages are already sorted, for example, in decreasing order as a function of the metrics, the combination of two symbols possessing the largest sum of metrics is always the value situated in the top left corner of the matrix, i.e. $S_{00}=U_0+V_0$, with S the matrix resulting from combining the two messages as input U and V. Thereafter, the following combination possessing the largest sum of metrics can correspond to the combination $(U_0+V_1)$ or $(U_1+V_0)$. At each step, the combination in the Galois field GF(q) of the symbols associated with the metrics is effected at the same time as the sum of the metrics.

The number of steps necessary for finding the $n_m$ combinations of symbols that are most probable, that is to say associated with the $n_m$ largest sums of metrics, is generally larger than the number $n_m$. Indeed, to be validated, a symbol arising from the combination of two input symbols must be different from the already calculated symbols.

The updating of a check node is a very important step of a non-binary LDPC decoding which takes a great deal of time, and which comprises a plurality of elementary updates.

The document "Low-complexity, low-memory EMS algorithm for non-binary LDPC codes" mentioned above describes a method making it possible to reduce the number of operations necessary for updating the check nodes while retaining performance close to decoding based on belief propagation (BP). However, the method described in that document is a method operating serially in the sense that an elementary update produces at most one doublet out of the $n_m$ of the output vector per clock period. The major problem of a serial implementation of an updating of a check node resides in its low data throughput.

It is possible to implement a plurality of serial processors working in parallel. However, at high working frequency and for small information blocks, the maximum parallelism may be very low retaining a limited maximum data throughput.

In the case of a parallel implementation making it possible to carry out an elementary update operation, it is not necessary to explore the $n_m^2$ doublets of the matrix. Since this matrix is devised on the basis of vectors sorted in decreasing order of metrics, the number of doublets of the matrix having a possibility of being in the output vector may be considerably reduced.

Figure 1:
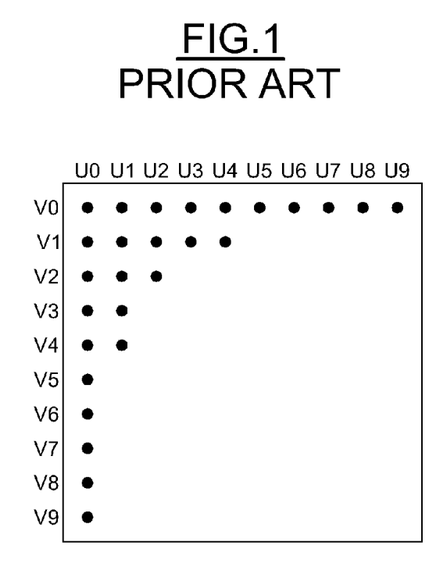
FIG. 1 illustrates the pattern represented by the potential doublets in a matrix according to the prior art.

The potential doublets of the matrix form a pattern as illustrated by black points in FIG. 1. The example presented in FIG. 1 is given for nm=10. The total number of potential doublets may be limited to 27 in the case where nm=10. The general formula making it possible to calculate the number of potential doublets depends on the number nm and is given by:

$$N = 2 \cdot \left( \sum_{k=1}^{kmax} \left\lfloor \frac{n_m}{k} \right\rfloor \right) - kmax^2 \quad (3)$$

With $kmax^2$ the largest square of an integer, the square of the integer being smaller than $n_m$, for example $kmax^2=9$ in the case where $n_m=10$, and $\lfloor x \rfloor$ the value rounded down to the integer below. It should be noted that the chosen number of potential doublets may be larger than that given by equation (3), so as to compensate for the problem of redundant symbols.

However, despite this reduction in the number of potential doublets, the number to be sorted remains large. Indeed for conventional values of $n_m=12$ or $n_m=16$, 35 or 50 values, respectively, must be sorted in parallel, thus requiring large parallel sorters and a low throughput.

Moreover, as regards the deletion of the redundant symbols, the most direct technique consists of comparing the symbols of each sorted potential doublet with the symbols of the other potential doublets and in deleting the doublets comprising identical symbols. Carrying out such an operation in parallel requires numerous comparators and multiplexers and considerably increases the block decoding time.

SUMMARY OF THE INVENTION

In a first aspect, the present invention provides for a method of elementary updating of a check node of a graph of a non-binary Low Density Parity Check (LDPC) code during a decoding of a block encoded with said LDPC code The method comprises receiving a first input message and of a second input message each comprising $n_m$ doublets, each doublet possessing a symbol and a metric associated with said symbol, the input messages being ordered according to a monotonic function applied to the metrics. The method further includes delivering an output message possessing $n_m$ output doublets by (i) computing a matrix comprising a first subset of p combined doublets on the basis of a combination of the doublets of the two input messages, p being greater than $n_m$, the p combined doublets possessing either the largest metrics or the lowest metrics and forming a chosen pattern within the matrix, and (ii) reducing the first subset so as to obtain the $n_m$ output doublets of the output message possessing either the $n_m$ largest metrics or the $n_m$ lowest metrics, (iii) tagging redundant symbols within each input message; and fixing at a reference value dependent on the choice of the values of metrics retained for the $n_m$ output doublets, the value of the metric of each combined doublet resulting from a combination of at least one doublet comprising a tagged redundant symbol.

In another aspect, the present invention provides for a decoder comprising an input for receiving a block encoded with a non-binary LDPC code and means for elementary updating of a check node of a graph of said code. The decoder is configured to receive a first input message and a second input message each message comprising $n_m$ doublets, a doublet comprising a symbol and a metric associated with the symbol, the input messages being ordered according to a monotonic function applied to the metrics, and to deliver an output message possessing $n_m$ output doublets. The means of elementary updating further comprises (i) a combining module configured to compute a matrix comprising a first subset of p combined doublets on the basis of a combination of the doublets of the two input messages, p being greater than $n_m$, the p combined doublets possessing either the largest metrics or the lowest metrics and forming a chosen pattern within the matrix, (ii) means of general reduction of the first subset so as to obtain the $n_m$ doublets of the output message possessing either the largest metrics or the lowest metrics, (iii) a first tagging module configured to tag redundant symbols within the first message, (iv) a second tagging module configured to tag redundant symbols within the second message, and (v) a marking module configured to fix, at a reference value dependent on the choice of the values of metrics retained for the $n_m$ output doublets, the value of the metric of each combined doublet resulting from a combination of at least one doublet comprising a tagged redundant symbol.

BRIEF DESCRIPTION OF THE DRAWINGS

Other advantages and characteristics of the invention will be apparent on examining the detailed description of wholly non-limiting embodiments and modes of implementation and the appended drawings in which.

DETAILED DESCRIPTION OF ILLUSTRATIVE EMBODIMENTS

Prior to detailing specific embodiments, illustrative embodiments of the invention will be discussed in general terms. Generally, the illustrative embodiments provide for a parallel implementation of a processor allowing an elementary updating of a check node of a block encoded with a non-binary LDPC code by which the processing speed of the elementary update operation is improved. It is in particular possible to carry out an elementary update operation on a check node in a clock period.

According to one aspect, there is thus proposed a method of elementary updating of a check node of the graph of a non-binary LDPC code during a decoding of a block encoded with the code, such as an LDPC code constructed on non-binary Galois fields of order q>2. The method comprises receiving a first input message and a second input message, each comprising $n_m$ doublets, wherein a doublet possesses a symbol and a metric associated with this symbol. The input messages is ordered according to the same monotonic function applied to the metrics. The input messages can thus be sorted in a manner decreasing as a function of the metrics or in a manner increasing as a function of the metrics.

The method thereafter comprises an elementary update process delivering an output message that has $n_m$ output doublets. The elementary update process illustratively comprises a computation of a matrix comprising a first subset of p combined doublets on the basis of a combination of the doublets of the two input messages, p being greater than $n_m$. The combination of two doublets results in a combined doublet comprising a combined symbol, resulting from a combination of the two input symbols, and an associated combined metric, resulting from an addition of the two input metrics associated with the input symbols. The p combined doublets possess either the largest metrics or the lowest metrics and form a chosen pattern within the matrix. The first subset can be, for example, determined on the basis of equation (3) above to determine the number of combined doublets.

The method also comprises a process for reducing the number of combined doublets so as to obtain the $n_m$ output doublets of the output message possessing either the $n_m$ largest metrics or the $n_m$ lowest metrics. It is possible to thus obtain as output the $n_m$ doublets possessing the largest metrics, or the $n_m$ doublets possessing the lowest metrics. In a case where it is desired to obtain as output the $n_m$ doublets possessing the largest metrics, the input messages will be ordered in decreasing order as a function of the metrics just like the output message. On the other hand, if it is desired to obtain the $n_m$ doublets possessing the lowest metrics as output, the input messages will be ordered in increasing order as a function of the metrics just like the output message.

According to a general characteristic of the illustrated embodiments, the elementary update process comprises tagging redundant symbols within each input message and fixing at a reference value, dependent on the choice of the values of metrics retained for the $n_m$ output doublets, the value of the metric of each combined doublet resulting from a combination of at least one doublet comprising a tagged redundant symbol.

This tagging of the redundant symbols within each message can be carried out before or in parallel with the combining of the input messages. Thus, the $n_m$ doublets of each of the two messages are compared so as to tag the redundant symbols in each message, instead, as in the prior art, of comparing each combined doublet with the p other combined doublets of the matrix so as to verify whether its symbol is redundant. This makes making it possible to save considerable time by carrying out fewer comparisons. The doublets of the input messages comprising redundant symbols are tagged. Thus when they are combined during the computation of the matrix, the metrics of the combined doublets resulting from a combination of at least one doublet comprising a tagged redundant symbol are fixed at a reference value. This reference value may be a minimum metric value such as a zero value in the case where the $n_m$ doublets of largest metrics are sought. In a case where the $n_m$ doublets of smallest metrics are sought rather than the $n_m$ doublets of largest metrics, the doublets of the matrix, of which one of the two combined symbols is a tagged redundant symbol, are forced to a reference value which may be a maximum metric value.

Fixing the metrics of certain combined doublets at a reference value makes it possible to delete them subsequently, that is to say to take no account thereof when the doublets are sorted according to the metrics and only the doublets comprising the largest or the lowest are selected.

If the metrics of the combined doublets resulting from a combination of at least one doublet comprising a tagged redundant symbol were not fixed at a reference value during the LDPC decoding, the overall performance would be greatly reduced, given that the combined doublets resulting from a combination of at least one doublet comprising a tagged redundant symbol would be duplicated and would be propagated during the recursive elementary update operation.

Advantageously, the computation of the matrix and the said tagging can be performed simultaneously so as to save additional processing time.

The process for reducing the number of doublets of the chosen pattern can advantageously comprise a grouping of the doublets of the chosen pattern into groups, a deletion of selected combined doublets of certain groups so as to obtain a second subset of combined doublets, and a selection of the $n_m$ output doublets from among the combined doublets of the second subset.

The doublets of the chosen pattern are divided into a diagonal group and non-diagonal groups, the diagonal group preferably comprising the doublets of the chosen pattern which are situated on the diagonal of the matrix. Preferably, each non-diagonal group comprises two vectors comprising an identical number of doublets of the chosen pattern.

Advantageously, the deletion can comprise the deletion of half the doublets of each of the non-diagonal groups, the retained doublets (i.e. the non-deleted doublets) being the doublets of the chosen pattern comprising the largest or the smallest metrics depending on whether it is desired to obtain the $n_m$ output doublets possessing the largest metrics or the $n_m$ output doublets possessing the lowest metrics. Preferably, the number of doublets of the diagonal group is not reduced.

Another aspect of the described embodiments provides for a decoder comprising an input for receiving a block encoded with a non-binary LDPC code and means of elementary updating of a check node of the graph of the said code, The means of elementary updating are configured to receive a first input message and a second input message each comprising $n_m$ doublets (a doublet comprising a symbol and a metric associated with this symbol) the input messages being ordered according to a monotonic function applied to the metrics, and to deliver an output message possessing $n_m$ output doublets. The means of elementary updating comprises a combining module configured to compute a matrix comprising a first subset of p combined doublets on the basis of a combination of the doublets of the two input messages, p being greater than $n_m$, the p combined doublets possessing either the largest metrics or the lowest metrics and forming a chosen pattern within the matrix, and means of general reduction of the number of combined doublets so as to obtain the $n_m$ doublets of the output message possessing either the largest metrics or the lowest metrics.

According to a general characteristic of the illustrative embodiments, the means of elementary updating of a check node further comprises a first tagging module configured to tag redundant symbols within the first message, a second tagging module configured to tag redundant symbols within the second message, and a marking module configured to fix, at a reference value dependent on the choice of the values of metrics retained for the $n_m$ output doublets, the value of the metric of each combined doublet resulting from a combination of at least one doublet comprising a tagged redundant symbol.

Advantageously, the combining module receives the first message in parallel with the first tagging module, and receives the second message in parallel with the second tagging module.

The means of general reduction can advantageously comprise reduction means configured to reduce the number of doublets of the chosen pattern so as to obtain a second subset of combined doublets, the reduction means operating intermediate the marking means and the selection means.

Preferably, the reduction means comprise a grouping module configured to group the doublets of the chosen pattern into groups and a plurality of reduction modules configured to delete certain doublets of certain of the groups, each reduction module receiving a non-diagonal group as input.

The grouping module preferably groups the doublets of the chosen pattern into a diagonal group and non-diagonal groups, the diagonal group comprising the doublets of the chosen pattern which are situated on the diagonal of the matrix. Advantageously, each non-diagonal group of the grouping module can comprise two vectors comprising an identical number of doublets.

Preferably, each deletion module is configured to delete half the doublets of the processed non-diagonal group, the retained doublets being the doublets of the chosen pattern comprising the largest or the smallest metrics. Preferably, the grouping module directly delivers the diagonal group to the selection module without the diagonal group undergoing any reduction.

Another aspect of the illustrative embodiments provides for an apparatus comprising a reception chain incorporating a decoder of the type described above.

Figure 2:
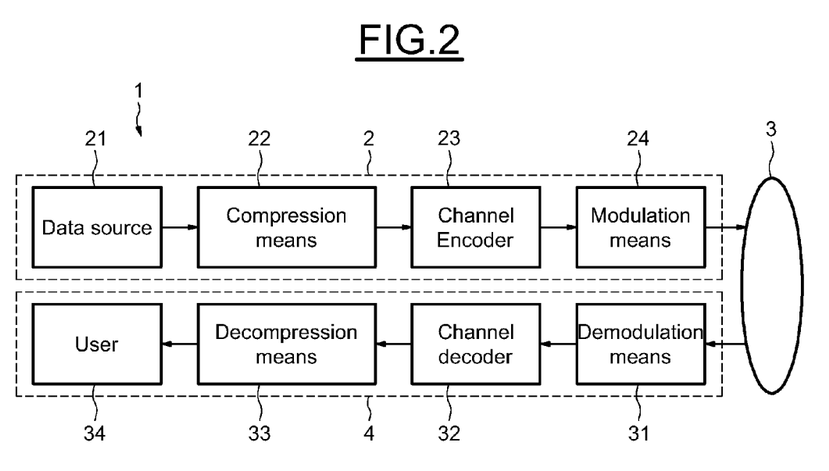
FIG. 2 schematically illustrates an exemplary internal structure of a communication system.

Turning now to a specific embodiment. FIG. 2 schematically illustrates a communication system 1 comprising a transmission chain 2, capable of transmitting coded and modulated information on a transmission channel 3, and a reception chain 4 capable of receiving and of decoding information originating from the transmission channel 3.

The transmission chain 2 comprises in a conventional manner a source of information 21 able to generate a succession of information blocks intended to be transmitted, and information compression means 22 able to increase the information throughput. It also comprises channel encoding means 23 that adds redundancy so as to be able subsequently to correct potential reception errors due to the noise of the transmission channel. These channel encoding means 23 comprise for example LDPC coding means. At the output of channel encoding means 23, the transmission chain 2 comprises modulation means 24 able to tailor the signal to the transmission channel 3.

The reception chain 4 comprises homologous means performing the inverse functions. More precisely, first of all are found demodulation means 31 and channel decoding means 32 making it possible to decode the information blocks previously encoded with the error correction code and possibly having undergone disturbances during transmission via the transmission channel 3. Thereafter may be found means 33 for decompressing the data before delivering the latter to an information user 34. Communication system 1 can be incorporated in a wireless communication apparatus, or else in a hard disk for example.

Figure 3:
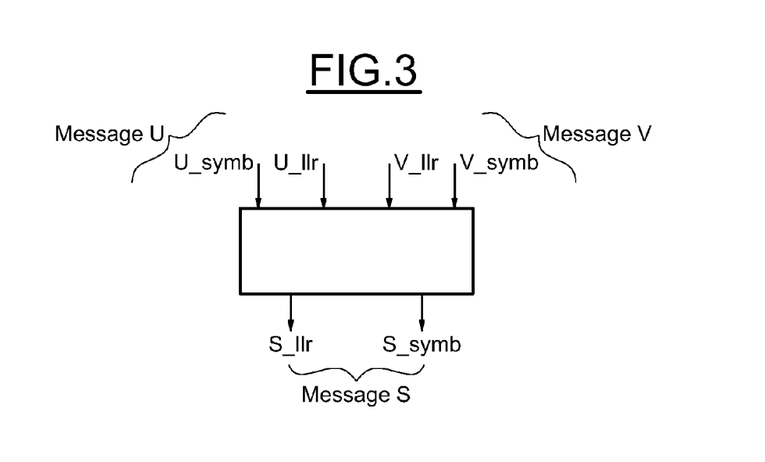
FIG. 3 represents in a schematic manner an exemplary mode of implementing a check node elementary update operation.

FIG. 3 schematically represents an elementary operation of updating a check node. During an update, two messages U and V are received as inputs, both composed of two vectors of $n_m$ values, and a message S of the same format, that is to say comprising two vectors of $n_m$ values, is delivered as output.

Each message is composed of a first vector X_llr comprising $n_m$ metrics sorted in decreasing order, these metrics can be values comprising a sign coded on $N_{llr}$ bits. Each message is also composed of a second vector X_symb comprising the $n_m$ symbols belonging to the Galois field GF(q) associated with the metrics of the first vector and sorted according to the same order. The symbols are coded on log 2(q) bits, i.e. for example 8 bits for a decoder operating on a Galois field GF(256).

In the described embodiment, the objective of an elementary update operation is to obtain the $n_m$ most probable symbols, that is to say the $n_m$ symbols associated with the largest metrics. That said, the invention is not limited to this example, and it would be possible to aim at obtaining the symbols associated with the lowest metrics.

As described previously, it may be considered that the messages comprise $n_m$ doublets, with a doublet comprising a symbol and the associated metric. In this case, it may be considered that the objective of an elementary update operation is to obtain the $n_m$ doublets comprising the $n_m$ largest metrics.

Figure 4:
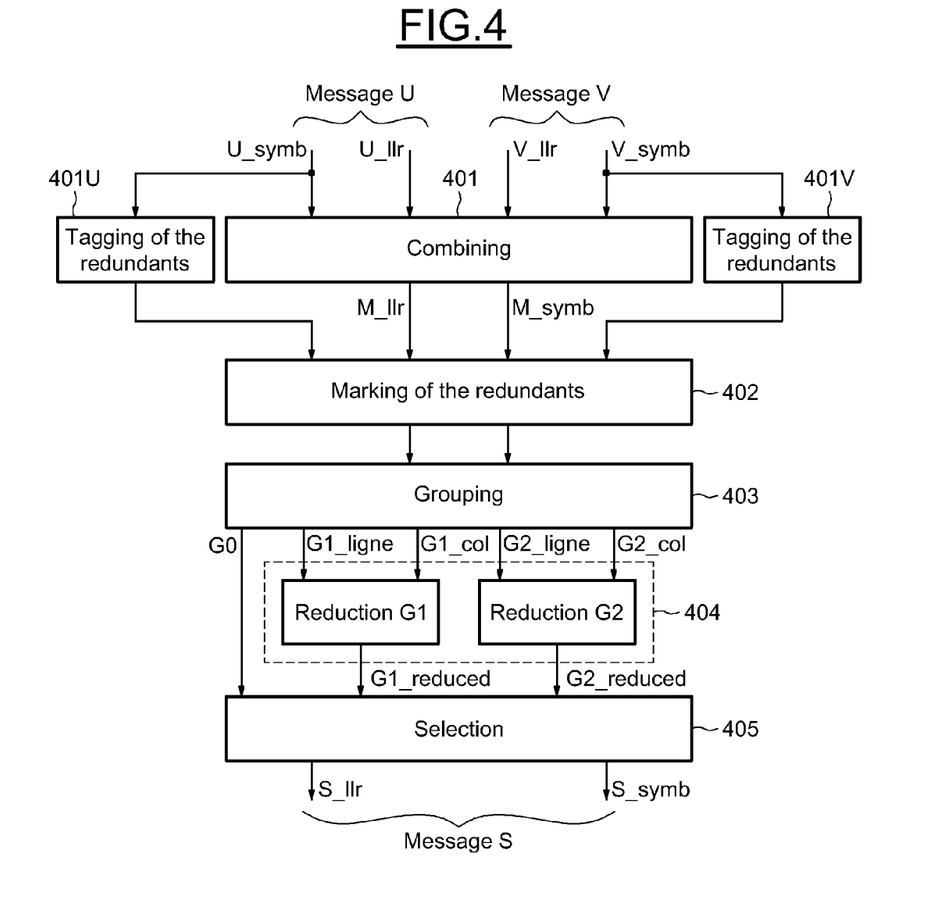
FIG. 4 illustrates in a schematic manner an exemplary method of elementary updating of a check node.

FIG. 4 schematically illustrates an exemplary method of elementary updating of a check node. Two input messages U and V each comprising a first vector X_llr comprising metrics and a second vector X_symb comprising the symbols associated with the metrics are taken into account. The first vector X_llr of each message is already sorted in a decreasing manner and the second vector X_symb of each message is sorted correspondingly.

In a step of tagging the redundant symbols 401U and 401V, the second vector U_symb and V_symb of each input message is analysed and the redundant symbols within each of the vectors U and V are tagged with the aid, for example, of markings (or "flags").

At the same time, in a combining step 401, a square matrix of metrics M_llr and a square matrix of symbols M_symb are initialized. The square matrices are of dimensions $(n_m \times n_m)$. The square matrix M_llr of metrics is produced by summing a metric of the first vector U_llr of the message U with a metric of the first vector V_llr of the message V. The square matrix of symbols M_symb is produced by combining (XOR-ing the bits) a symbol of the second vector U_symb of the message U with a symbol of the second vector V_symb of the message V.

Hereinafter and for the sake of simplification will be considered a single matrix M comprising doublets each comprising a symbol and the associated metric. During the computation of the matrix M of doublets, a first number p of combined doublets is determined so as to obtain a first subset of combined doublets. The first subset of combined doublets possesses the p combined doublets comprising the p largest metrics, and forms a chosen pattern MT within the matrix M. The first subset can be, for example, determined on the basis of equation (3) above so as to determine the number of combined doublets.

On completion of the combining 401, the matrix M thus comprises $n_m^2$ doublets, each doublet comprising a combination of a symbol of the first message U with a symbol of the second message V as well as the sum of the two associated metrics.

In a following step of marking the redundants 402, the metrics of the doublets of the chosen pattern MT of the matrix M, of which one of the two combined symbols is a redundant symbol tagged during the tagging 401U and 401V of the redundant symbols in each message U and V, are fixed at a reference value. More explicitly, the metric of these doublets is fixed at a reference value which can be a minimum value such as a zero value.

In a case where the $n_m$ doublets of smallest metrics are sought rather than the $n_m$ doublets of largest metrics, the doublets of the chosen pattern MT of the matrix M, of which one of the two combined symbols is a tagged redundant symbol, are forced to a reference value which can be a maximum metric value. In a following grouping step 403, the p combined doublets of the first subset are divided into groups.

In a reduction step 404, certain groups will undergo a reduction in the number of doublets included in the group so that there then remain only half the doublets in the groups thus reduced, the doublets remaining in the reduced groups being the doublets comprising the largest metrics of each group before reduction.

This reduction step 404 makes it possible to delete the redundant doublets marked in the step of marking the redundants 402 of the reduced groups resulting from this reduction step 404. Indeed, the doublets marked as redundant have had their metric fixed at a minimum reference value and therefore cannot be selected from the reduced groups.

In a final selection step 405, the doublets remaining in the reduced groups and the non-reduced groups are sorted and selected in parallel so that the output message comprises only the $n_m$ doublets comprising the largest metrics and that it is ordered in decreasing order as a function of the metrics.

This selection step 405 also makes it possible to delete the doublets marked as redundant which would be situated in the diagonal group G0 which has not been reduced previously. Indeed, the doublets marked as redundant have had their metric fixed at a minimum reference value and therefore cannot be selected since the doublets are sorted before being selected.

Several sortings in parallel are possible and known, such as a "Prank" sorter or a "Bitonic" sorter.

A "Prank" sorter constructs a matrix on the basis of a vector of metrics of the doublets received as input. The sorter compares the input metrics pairwise and returns a rank for each of them on the basis of the result of these comparisons. The rank of each metric makes it possible to determine the new order of the doublets so as to sort them in decreasing order.

A "bitonic" sorter is based on an elementary method which takes two lists of N values each sorted and produces a list of 2N sorted values, and a recursive algorithm of "divide and conquer" type.

Figure 5:
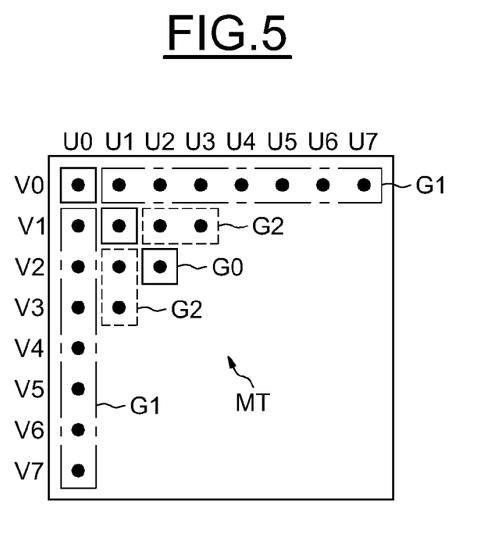
FIG. 5 presents in a schematic manner an exemplary pattern formed within the matrix by the symbols taken into account on completion of an exemplary combining step.

FIG. 5 represents in a schematic manner a pattern formed by the p doublets selected on completion of the combining step 401. In the case of a parallel implementation making it possible to carry out an elementary update operation, it is not necessary to calculate the $n_m^2$ combinations of doublets of the matrix M. Since this matrix is produced on the basis of vectors sorted in decreasing order of metrics, the number of doublets of the matrix M having a possibility of being in the output message S may be considerably reduced.

The potential doublets of the matrix M may form a pattern MT which may be different from the pattern illustrated in FIG. 1. An exemplary pattern is given in FIG. 5. In the matrix M represented, each black point corresponds to a combined doublet comprising a combination of two symbols and a sum of the two associated metrics.

During the grouping step 403, the combined doublets included in the chosen pattern MT are separated into various groups. A diagonal group comprises the combined doublets of the pattern MT which are situated on the diagonal of the matrix M. These combined doublets are grouped together in a single vector G0 which will not be deduced.

A first non-diagonal group G1 comprises the combined doublets of the pattern MT which are situated in the first column or in the first row of the matrix M with the exception of the doublet already included in the diagonal group. This first non-diagonal group thus comprises two vectors; a first vector G1_row comprising the combined doublets of the first row of the matrix M, and a second vector G1_col comprising the combined doublets of the first column of the matrix M.

A second non-diagonal group G2 comprises the combined doublets of the pattern MT which are situated in the second column or in the second row of the matrix M with the exception of the combined doublet already included in the diagonal group and of the combined doublets already included in the first non-diagonal group. This second group also comprises two vectors; a first vector G2_row comprising the combined doublets of the second row, and a second vector G2_col comprising the combined doublets of the second column.

If the p combined doublets of the chosen pattern MT are distributed over a pattern comprising more than two columns and two rows, then as many non-diagonal groups are constructed as degrees of columns and of rows over which the p combined doublets are distributed.

Figure 6:
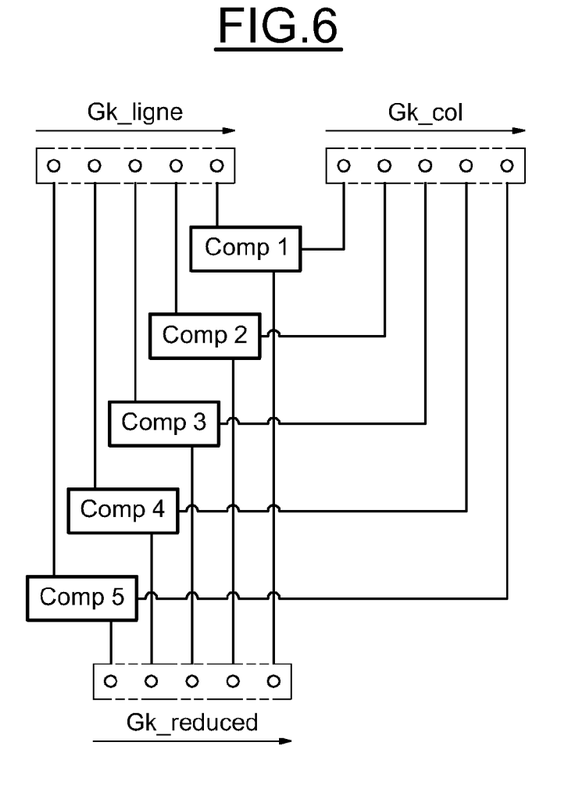
FIG. 6 represents an exemplary implementation of a step of reducing a non-diagonal group in an elementary update method.

FIG. 6 presents an exemplary implementation of a reduction step 404 for reducing a non-diagonal group Gk in an elementary update method. The objective of this step consists in reducing the number of combined doublets of a group before the following selection step 405 and also makes it possible to delete the previously marked redundant doublets, that is to say fixed at a reference value, included in the diagonal group G0 inter alia.

The reduction 404 takes place only on the combined doublets of the non-diagonal groups Gk. As specified previously, each non-diagonal group Gk comprises a first row vector Gk_row and a first non-diagonal vector of Gk_col. The row vector Gk_row of a group comprises the same number of combined doublets as the column vector Gk_col of the same group. The combined doublets of each of these two vectors are sorted in decreasing order as a function of the metrics. It is possible to extract from a group half the combined doublets of the group having the largest metrics.

In the example illustrated in FIG. 6, each vector Gk_row and Gk_col is sorted in a decreasing order so that the first combined doublet of each vector corresponds to the combined doublet possessing the largest metric of the vector, and that the last combined doublet of each vector corresponds to the combined doublet having the smallest metric.

In the example illustrated, the vectors each comprise five combined doublets. The step of reducing a group is carried out by comparing the metric of the last combined doublet of the row vector Gk_row with the metric of the first combined doublet of the column vector Gk_col. The combined doublet having the largest metric is retained in the vector of the reduced group Gk_reduced. Thereafter, the metric of the penultimate combined doublet, i.e. the metric of the fourth combined doublet, in the example illustrated, of the row vector Gk_row is compared with the metric of the second column doublet Gk_col. The combined doublet having the largest metric is retained in the vector of the reduced group Gk_reduced. The same comparison method is used until the metric of the first combined doublet of the row vector Gk_row is compared with the metric of the last combined doublet of the column vector Sk_col and until the combined doublet having the largest metric of the two is retained in the vector of the reduced group Gk_reduced.

On completion of the reduction 404, each non-diagonal group then comprises only half of the combined doublets possessing the largest metrics of the group.

Figure 7:
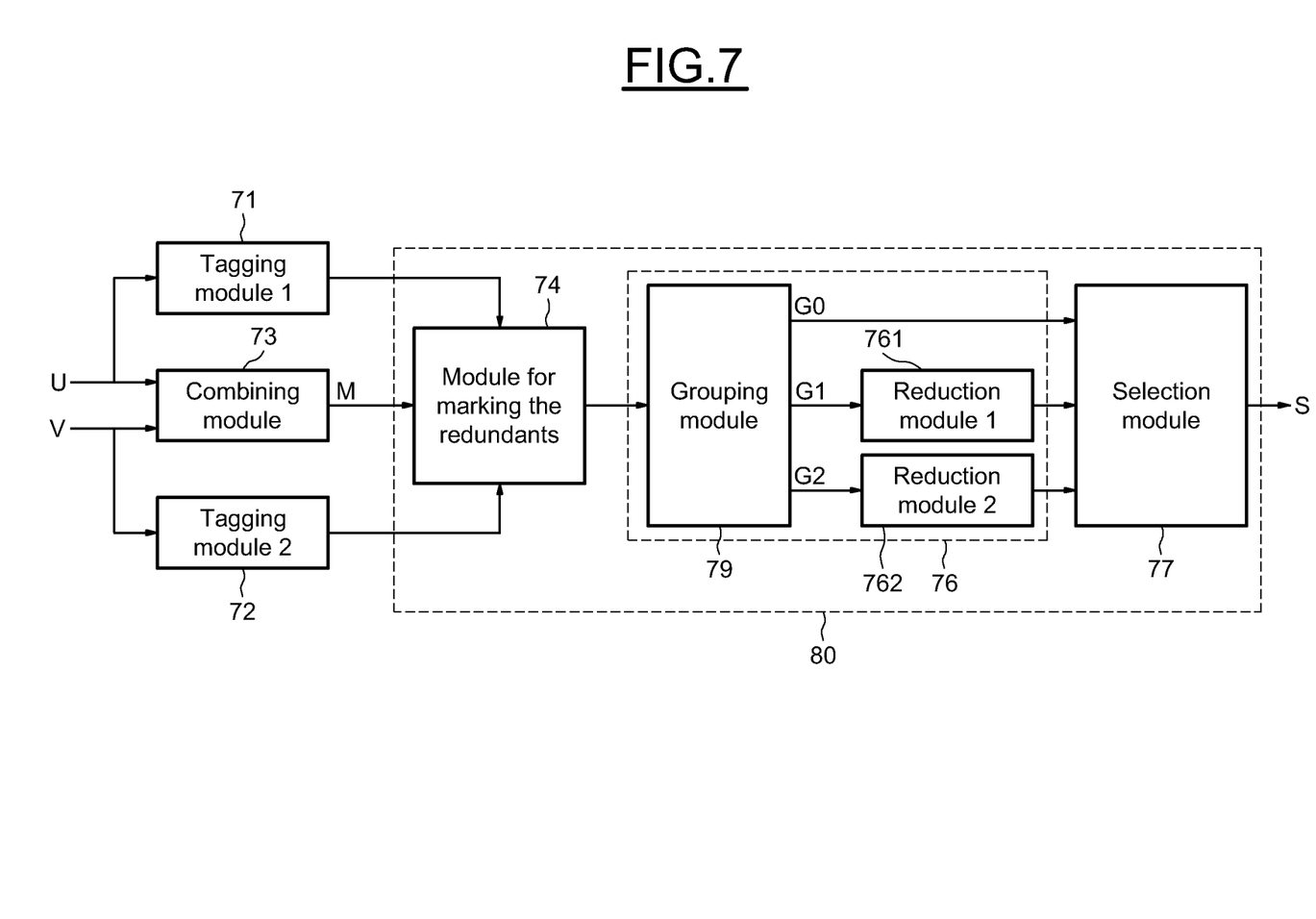
FIG. 7 presents in a schematic manner an exemplary embodiment of check node updating means.

FIG. 7 presents in a schematic manner an exemplary embodiment of means for updating a check node receiving two messages U and V as input. The means for updating a check node comprise a first tagging module 71 able to tag the redundant symbols within the first message U and a second tagging module 72 able to tag the redundant symbols within the second message V. It also comprises a combining module 73 able to initialize a square matrix M of dimensions $(n_m \times n_m)$ comprising a first subset of doublets combined on the basis of a doublet of the first message U with a doublet of the second message V, the combining of two doublets delivering a combined doublet comprising a combined symbol arising from a combination of the two input symbols and an associated combined metric arising from an addition of the two input metrics associated with the input symbols. The first subset of combined doublets possesses the largest metrics and forms a chosen pattern MT within the matrix M. The tagging modules 71 and 72 work in parallel with the combining module 73.

The matrix M initialized by the combining module 73 is delivered to a marking module 74 which also receives the indications of doublets comprising redundant symbols of the tagging modules 71 and 72. The marking module 74 fixes the metrics of the combined doublets of the chosen pattern MT of the matrix M, said pattern arising from a combination of at least one doublet comprising a redundant symbol, at a minimum reference value.

The p combined doublets of the first subset of the resulting matrix M are then delivered by the marking module 74 to means of general reduction 80, and more particularly to reduction means 76 able to reduce the number of doublets of the chosen pattern MT so as to obtain a second subset of combined doublets.

The second reduction means 76 comprise a grouping module 79 able to group the doublets of the pattern MT into groups and a plurality of reduction modules able to delete certain doublets of certain of the groups Gk. In this illustrated example the second reduction means comprise two reduction modules 761 and 762 receiving respectively as input the first non-diagonal group G1 and the second non-diagonal group G2. The first non-diagonal group G1 comprises the combined doublets of the first row and of the first column of the chosen pattern MT of the matrix M with the exception of the doublet already included in the diagonal group G0, and the second non-diagonal group G2 comprises the combined doublets of the second row and of the second column of the chosen pattern MT of the matrix M with the exception of the doublet already included in the diagonal group G0 and of the doublets already included in the first non-diagonal group G1. The first reduction module 761 reduces the number of combined doublets included in the first non-diagonal group G1 by half and the second reduction module 762 reduces the number of combined doublets included in the second non-diagonal group G2 by half. The doublets retained in each group are the doublets possessing the largest metrics of the group.

Finally, the means for updating a check node comprise a selection module 77 able to select the $n_m$ doublets included in the output message S on the basis of the diagonal group G0 delivered by the grouping module 79, of the first reduced non-diagonal group G1_reduced delivered by the first reduction module 761, and of the second reduced non-diagonal group G2_reduced delivered by the second reduction module 762.

All these means can be affected by software modules within a processor and/or by logic circuits.

What is claimed is:

1. A method of elementary updating of a check node of a graph of a non-binary Low Density Parity Check (LDPC) code during a decoding of a block encoded with said LDPC code, comprising:
   receiving a first input message and a second input message each comprising $n_m$ doublets, each doublet possessing a symbol and a metric associated with said symbol, the input messages being ordered according to a monotonic function applied to the metrics,
   delivering an output message possessing $n_m$ output doublets by (i) computing a matrix comprising a first subset of p combined doublets on the basis of a combination of the doublets of the two input messages, p being greater than $n_m$, the p combined doublets possessing either the largest metrics or the lowest metrics and forming a chosen pattern within the matrix, and (ii) reducing the first subset so as to obtain the $n_m$ output doublets of the output message possessing either the $n_m$ largest metrics or the $n_m$ lowest metrics, and (iii) tagging redundant symbols within each input message; and fixing at a reference value dependent on the choice of the values of metrics retained for the $n_m$ output doublets, the value of the metric of each combined doublet resulting from a combination of at least one doublet comprising a tagged redundant symbol.

2. The method according to claim 1 wherein the reference value is a high value if one wishes to retain the $n_m$ lowest metrics, and the reference value is a low value if one wishes to retain the $n_m$ highest metrics.

3. The method according to claim 1 wherein computing the matrix and tagging redundant symbols are performed simultaneously.

4. The method according to one of claim 1 wherein reducing the first subset comprises grouping the doublets of the chosen pattern into groups, deleting selected combined doublets of selected groups so as to obtain a second subset of combined doublets, and selecting the $n_m$ output doublets from among the combined doublets of the second subset.

5. The method according to claim 4 wherein the doublets of the chosen pattern are divided into a diagonal group and non-diagonal groups, the diagonal group comprising the doublets of the chosen pattern which are situated on the diagonal of the matrix.

6. The method according to claim 5 wherein each non-diagonal group comprises two vectors comprising an identical number of doublets of the chosen pattern.

7. The method according to claim 5 wherein the step of deleting comprises deleting half the doublets of each of the non-diagonal groups, the retained doublets being the doublets of the chosen pattern comprising the largest or the smallest metrics.

8. The method according to one of claim 5 wherein the number of doublets of the diagonal group (G0) is not reduced.

9. A decoder comprising:
an input for receiving a block encoded with a non-binary LDPC code;
means for elementary updating of a check node of a graph of said code, configured to receive a first input message and a second input message each message comprising $n_m$ doublets, a doublet comprising a symbol and a metric associated with the symbol, the input messages being ordered according to a monotonic function applied to the metrics, and to deliver an output message possessing $n_m$ output doublets, the means of elementary updating further comprising (i) a combining module configured to compute a matrix comprising a first subset of p combined doublets on the basis of a combination of the doublets of the two input messages, p being greater than $n_m$, the p combined doublets possessing either the largest metrics or the lowest metrics and forming a chosen pattern within the matrix, (ii) means of general reduction of the first subset so as to obtain the $n_m$ doublets of the output message possessing either the largest metrics or the lowest metrics, (iii) a first tagging module configured to tag redundant symbols within the first message, (iv) a second tagging module configured to tag redundant symbols within the second message, and (v) a marking module configured to fix, at a reference value dependent on the choice of the values of metrics retained for the $n_m$ output doublets, the value of the metric of each combined doublet resulting from a combination of at least one doublet comprising a tagged redundant symbol.

10. The decoder according to claim 9 wherein the combining module is further configured to receive the first message in parallel with the first tagging module, and to receive the second message in parallel with the second tagging module.

11. The decoder according to claim 9 characterized in that the means of general reduction includes reduction means configured to reduce the number of doublets of the chosen pattern so as to obtain a second subset of combined doublets, the reduction means operating intermediate operation of the marking means and the selection means.

12. The decoder according to claim 11 wherein the reduction means comprise a grouping module configured to group the doublets of the chosen pattern into groups, and a plurality of reduction modules configured to delete selected doublets of selected groups, each reduction module receiving a non-diagonal group as input.

13. The decoder according to claim 12 wherein grouping module is configured to group the doublets of the chosen pattern into a diagonal group and non-diagonal groups, said diagonal group comprising doublets of the chosen pattern which are situated on a diagonal of the matrix.

14. The decoder according to claim 13 wherein each non-diagonal group of the grouping module includes two vectors comprising an identical number of doublets.

15. The decoder according to claim 13 wherein each reduction module is configured to delete half the doublets of the processed non-diagonal group, the retained doublets being the doublets of the chosen pattern comprising the largest or the smallest metrics.

16. The decoder according to claim 13 wherein the grouping module is further configured to directly deliver the diagonal group to the selection module.

17. An apparatus comprising:
a reception chain incorporating a decoder, the decoder comprising:
an input for receiving a block encoded with a non-binary LDPC code;
means for elementary updating of a check node of a graph of said code, configured to receive a first input message and a second input message each message comprising $n_m$ doublets, a doublet comprising a symbol and metric associated with the symbol, the input messages being ordered according to a monotonic function applied to the metrics, and to deliver an output message possessing $n_m$ output doublets, the means of elementary updating further comprising (i) a combining module configured to compute a matrix comprising a first subset of p combined doublets on the basis of a combination of the doublets of the two input messages, p being greater than $n_m$, the p combined doublets possessing either the largest metrics or the lowest metrics and forming a chosen pattern within the matrix, (ii) means of general reduction of the first subset so as to obtain the $n_m$ doublets of the output message possessing either the lamest metrics or the lowest metrics, (iii) a first tagging module configured to tag redundant symbols within the first message, (iv) a second tagging module configured to tag redundant symbols within the second message, and (v) a marking module configured to fix, at a reference value dependent on the choice of the values of metrics retained for the $n_m$ output doublets, the value of the metric of each combined doublet resulting from a combination of at least one doublet comprising a tagged redundant symbol.

18. The apparatus according to claim 17, wherein means of general reduction includes reduction means configured to reduce the number of doublets of the chosen pattern so as to obtain a second subset of combined doublets, the reduction means operating intermediate operation of the marking means and the selection means.

19. The apparatus according to claim 18, wherein the reduction means comprise a grouping module configured to group the doublets of the chosen pattern into groups, and a plurality of reduction modules configured to delete selected doublets of selected groups, each reduction module receiving a non-diagonal group as input.

20. The apparatus according to claim 19, wherein grouping module is configured to group the doublets of the chosen pattern into a diagonal group and non-diagonal groups, said diagonal group comprising doublets of the chosen pattern which are situated on a diagonal of the matrix.

* * * * *

UNITED STATES PATENT AND TRADEMARK OFFICE
CERTIFICATE OF CORRECTION

| | | |
|---|---|---|
| PATENT NO. | : 8,468,438 B2 | |
| APPLICATION NO. | : 12/880844 | |
| DATED | : June 18, 2013 | |
| INVENTOR(S) | : Heinrich et al. | |

It is certified that error appears in the above-identified patent and that said Letters Patent is hereby corrected as shown below:

Title Page, Item (75), Inventors, 1$^{st}$ line, delete "Izeaux" and insert --La Tronche--.

In the Claims:
In Col. 14, line 53, Claim 17, delete "lamest" and insert --largest--.

Signed and Sealed this
Sixth Day of August, 2013

Teresa Stanek Rea
*Acting Director of the United States Patent and Trademark Office*